United States Patent [19]

Tomisawa et al.

[11] Patent Number: 4,783,605
[45] Date of Patent: Nov. 8, 1988

[54] LOGIC CIRCUIT MADE OF BIOMATERIALS SUCH AS PROTEIN FILMS

[75] Inventors: Osamu Tomisawa; Satoru Isoda, both of Hyogo, Japan

[73] Assignee: Mitsubishi Denki K.K., Tokyo, Japan

[21] Appl. No.: 69,319

[22] Filed: Jul. 2, 1987

[30] Foreign Application Priority Data

Jul. 11, 1986 [JP] Japan .................. 61-164181

[51] Int. Cl.⁴ .............. B32B 9/00; B32B 15/04; H01L 29/28; G01N 27/22
[52] U.S. Cl. .............. 307/450; 307/482; 307/303; 357/8; 357/23.7; 428/459; 428/333; 436/84
[58] Field of Search ........... 307/201, 450, 462, 476, 307/478, 571, 306, 298, 299.1, 304, 303, 200.1, 459, 477, 482.1; 357/8, 23.7; 428/458, 459, 336, 333, 500; 436/84

[56] References Cited

U.S. PATENT DOCUMENTS

| | | | |
|---|---|---|---|
| 3,634,336 | 1/1972 | Perez-Albuerne | 357/8 X |
| 3,833,894 | 9/1974 | Aviram et al. | 357/8 X |
| 3,953,874 | 4/1976 | Aviram et al. | 357/8 |
| 3,980,896 | 9/1976 | Kato | 307/451 X |
| 4,103,064 | 7/1978 | McAlear et al. | 428/459 X |
| 4,210,498 | 1/1980 | Tamura et al. | 357/8 X |
| 4,613,541 | 9/1986 | Isoda | 428/459 X |
| 4,710,650 | 12/1987 | Shoji | 307/451 X |
| 4,721,601 | 1/1988 | Wrighton et al. | 324/60 R X |
| 4,728,591 | 3/1988 | Clark et al. | 428/333 X |

Primary Examiner—John S. Heyman
Assistant Examiner—David R. Bertelson
Attorney, Agent, or Firm—Takeuchi Patent Office

[57] ABSTRACT

A logic circuit has the first electron transmission protein film made of the first electron transmission protein, the second electron transmission protein made of the second electron transmission protein having a redox potential different from that of the first electron transmission protein and glued on top of the first electron transmission film, the third electron transmission protein made of the third electron transmission protein having a redox potential different from that of the second electron transmission protein and glued on top of the second electron transmission protein film, an electrode connected to the first electron transmission protein film, an electrode having an electrical influence on the second electron transmission protein film, and an electrode connected to the third electron transmission protein film to form transistors making use of differences in redox potential among the respective electron transmission proteins for performing a logical operation for a plurality of inputs.

6 Claims, 5 Drawing Sheets

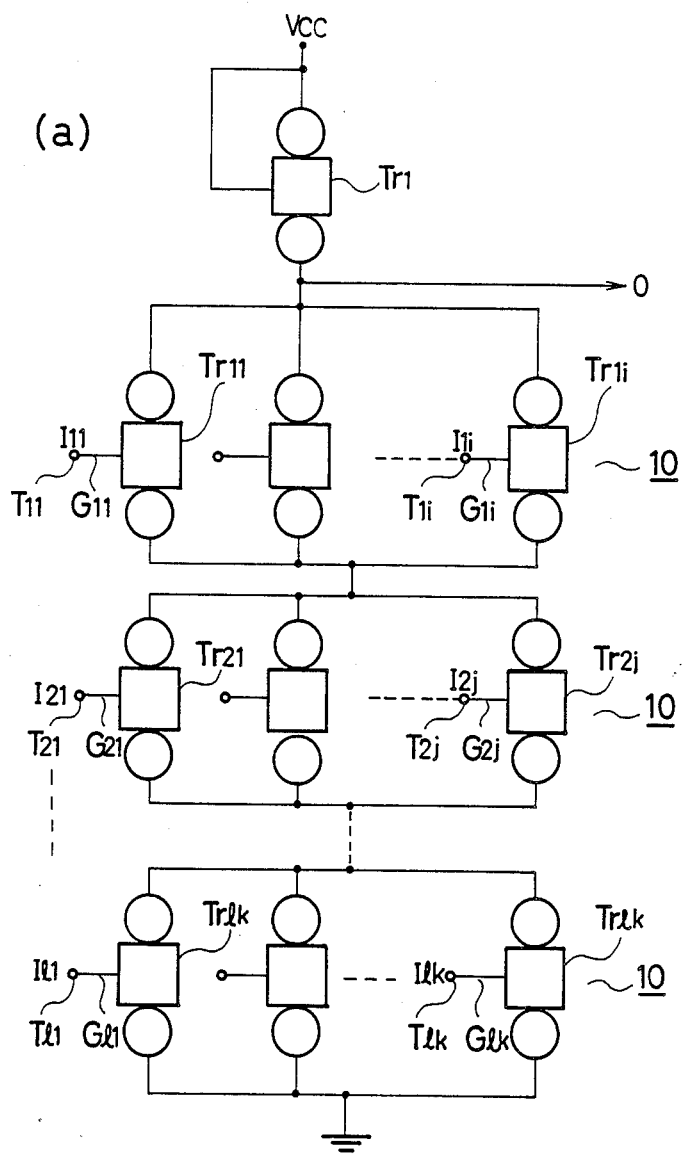

LOGIC CIRCUIT MADE OF BIOMATERIALS SUCH AS PROTEIN FILMS

BACKGROUND OF THE INVENTION

1. Field of the Invention

The present invention relates to a logic circuit with transistor elements made of biomaterials.

2. Description of the Prior Art

A field effect transistor such as shown in FIG. 3 has been used for an integrated circuit. It consists of a p-type silicon substrate 1, a channel region 2, and $n^+$ 'layer 3, an $SiO_2$ 'film 4, a source electrode 5, a gate electrode 6, and a drain electrode 7. The gate voltage applied to the gate electrode is controlled to provide a switching function.

The microscopic process of such conventional FETs is so useful that a variety of very large scale integrated circuits have been made using these FETs. However, high performance VLSI microstructures smaller than 0.2 microns have been impossible because of the drain-source punch through effect, gate oxide film, drain junction dielectric strength, and/or doped impurity statistic dispersion.

SUMMARY OF THE INVENTION

It is a primary object of the invention to provide a logic circuit smaller than the conventional transistor elements for integrated circuits.

According to the invention there is provided a high density and high speed logic circuit made of biomaterials having the size of transistor elements close to that of molecules of an organism.

Other objects, features, and advantages of the invention will be more apparent from the following description when taken in conjunction with the accompanying drawings.

DESCRIPTION OF THE PREFERRED EMBODIMENTS

In the biological film of a microorganism or the mitochondria endosporium of an organism, there are enzyme proteins to draw electrons from reducing chemical materials, such as $H_2$, organic acids, and nicotineamide adenine dinucleotide (phosphate), and some other proteins to transmit the electrons in a predetermined direction in the organismic film (hereinafter called "electron transmission protein"). These electron transmission proteins are embedded in the organismic film in a predetermined orientation so that they may have a special molecular arrangement so as to cause electron transmission between molecules. In other words, they are disposed in the form of a precise chain in the organismic film so that electrons may flow along the protein chain. Thus, the movement of electrons may be controlled at molecular levels.

The electron transmission proteins cause redox or oxidation-reduction reactions in transmission of electrons so that electrons may flow from the negative level to the positive level in the redox potential of each electron transmission protein. Consequently, two kinds of electron transmission proteins A and B may be laminated in three layers A-B-A to form a junction having a transistor or switching function making use of a difference between these redox potentials.

Figure 2:
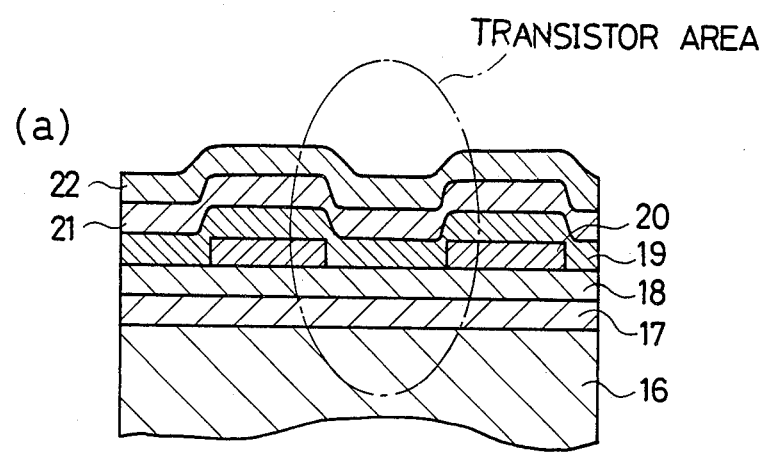
FIGS. 2(a) and (b) are a sectional view of a transistor of the logic circuits of FIG. 1 and its equivalent circuit diagram.
Figure 2:
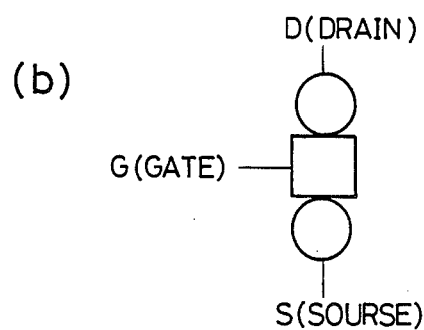
Figure 3:
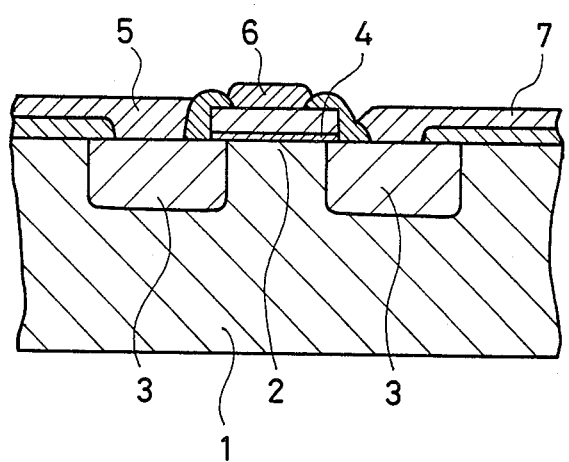
FIG. 3 is a sectional view of a conventional MOS field effect transistor.

Referring now to FIG. 2 there is shown a switching or transistor element useful for a logic circuit according to the invention. A plurality of parallel electrodes 17 made of a metal, such as silver, gold, or aluminum, are formed on a glass substrate 16. A first electron transmission protein film 18 made of a flavodoxin electron transmission protein is formed on the electrode 17. A plurality of parallel electrodes 20 are formed on the first electron transmission protein film 18 in perpendicular to the parallel electrodes 17. A second electron transmission protein film 19 made of a cytochrome c electron transmission protein is glued on top of the first electron transmission protein film 18 and joined to the electrodes 20. A third electron transmission protein film 21 made of a flavodoxin electron transmission protein is glued on top of the second electron transmission protein film 19. A plurality of parallel electrodes 22 are formed on the third electron transmission protein film 21 in perpendicular to the parallel electrodes 20.

The first electron transmission protein film 18 serves as a dielectric between the electrodes 17 and 20 to keep the insulation between the electrodes 17 and 20. When the first, second, and third electron transmission protein films 18, 19, and 21 are oriented, electrons may move across the electrodes 17 and 22. The electrode 20 is insulative to the second electron transmission protein 19 but may be controlled by the application of a voltage. In other words, the electrode 20 corresponds to the gate electrode of a conventional FET and the electrodes 17 and 22 to the source and drain electrodes, respectively.

Figure 4:
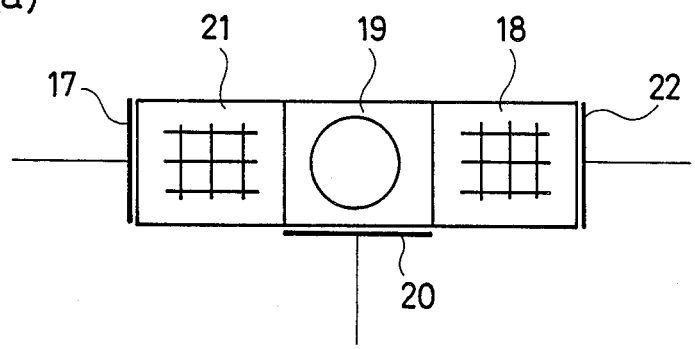
FIGS. 4(a) and (b) illustrate the operation principle of the transistor of FIG. 2.
Figure 4:
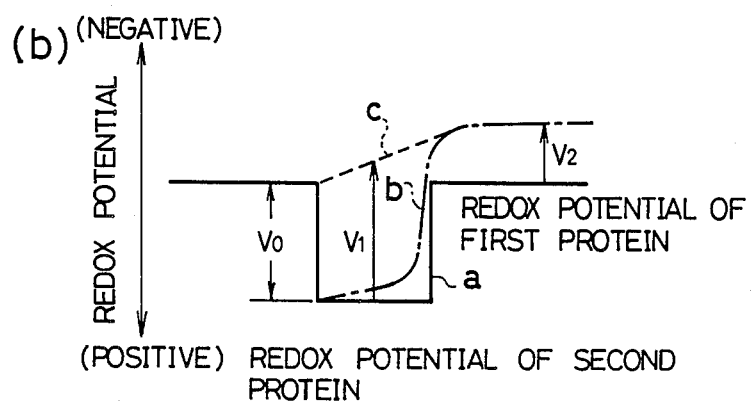

As FIG. 4(a) shows, the above switching element consists of the cytochrome c molecules 19, the flavodoxin films 21 and 18 glued on either side, and the electrodes 17, 20, and 22 connected to each of them. The redox potential state of the respective electrodes 17, 20, and 22 to which no voltages are applied are shown by a solid line a in FIG. 4(b). The redox potential states when negative voltages V2 and (V2+V1) with respect to the electrode 17 are applied to the electrodes 22 and 20 are shown by broken and dotted lines b and c, respectively. In the states a and b, no current flows between the electrodes 17 and 22, but in the state c, some current flows. Consequently, the element may be used as a swiching device by turning on and off the voltage V1 applied between the electrodes 17 and 20 and the voltage V2 applied between the electrodes 17 and 22.

FIG. 1(a) shows an equivalent circuit of the logic circuit according to the invention. Each transistor has a structure such as shown in FIG. 2. The drain and gate of a load transistor Tr1 are connected to a power supply Vcc and its source is connected to an output terminal O. The drains of respective i transistors Tr11 through Tr1$i$, j transistors Tr21 through Tr2$j$, and k transistors Trl1 through Trlk are connected in parallel to the common terminals, constituting l circuit groups 10. These l circuit groups 10 are connected in series, with the common drain terminal of the top circuit group 10 connected to the output terminal O and the common source terminal of the bottom circuit group connected to the ground. The gates G11 through G1$i$, G21 through G2$j$, Gl1 through G1k of the transistors in the respective stages are connected to terminals T11 through T1i, T21 through T2j, and Tl1 through Tlk, into which respective input signals I11 through I1i, I21 through I2j, and Il1 through Ilk are put, constituting a driving transistor network. i, j, and k may be the same numbers, and the network may have the inputs of a matrix of i×1 transistors. The circuit groups other than the top circuit group 10 may be eliminated. Each circuit group 10 may be composed of only one transistor.

Figure 1:
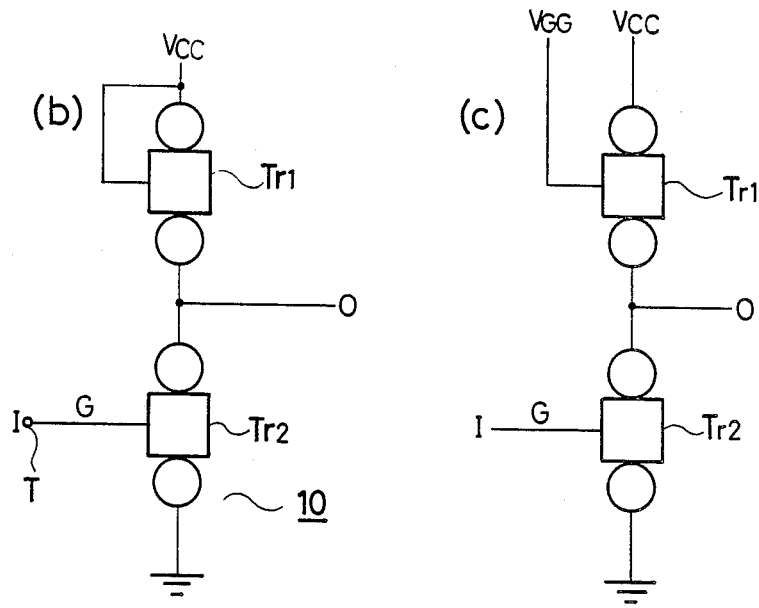
FIGS. 1(a), (b), and (c) are circuit diagrams of respective logic circuits embodying the present invention.

When the input I is at a level of "H", each transistor in the logic circuit of FIG. 1 is turned on so that the output is given by the following logic equation $$O = \overline{(I_{11} + I_{12} + \ldots + I_{1i}) * (I_{21} + \ldots + I_{2j}) * \ldots * (I_{l1} + \ldots I_{lk})}$$

where + and * mean the logical sum and logical product, respectively.

FIG. 1(b) shows an inverter circuit which is the simplest case of the above logic circuit. This circuit has a single input terminal T, a single circuit group (l=1) composed of a single transistor Tr2. When a signal I input into the terminal T is at "H", the transistor Tr2 is turned on, bringing the output O to "L". When the input signal I is at "L", the transistor Tr2 is turned off, bringing the output to "H" through the load transistor Tr1. In other words, this circuit functions as an inverter amplifier.

FIG. 1(c) shows another circuit in which an additional power supply VGG is connected to the load transistor Tr1.

As has been described above, the logic circuit according to the invention has the first electron transmission protein film made of the first electron transmission protein, the second electron transmission protein made of the second electron transmission protein having a redox potential different from that of the first electron transmission protein and glued on top of the first electron transmission film, the third electron transmission protein made of the third electron transmission protein having a redox potential different from that of the second electron transmission protein and glued on top of the third electron transmission protein film, the electrode connected to the first electron transmission protein film, the electrode having an electrical influence on the second electron transmission protein film, and the electrode connected to the third electron transmission protein film to form transistors making use of differences in redox potential among the respective electron transmission proteins for performing a logical operation for a plurality of inputs, so that the size of the logic circuit is close to that of organismic molecules, making the realization of a high density and high speed logic circuit possible.

While a preferred embodiment of the invention has been described using specific terms, such description is for the illustrative purpose only, and it is to be understood that changes and variations may be made without departing from the spirit and scope of the invention defined in the following claims.

What is claimed is:

1. A logic circuit having an output terminal and at least one input terminal, which comprises:
   a first electron transmission protein film made of a first electron transmission protein;
   a second electron transmission protein film made of a second electron transmission protein having a redox potential different from that of said first electron transmission protein and joined on top of said first electron transmission protein film;
   a third electron transmission protein film made of a third electron transmission protein having a redox potential different from that of said second electron transmission protein and joined on top of said second electron transmission protein film;
   a source electrode connected to said first electron transmission protein film;
   a gate electrode having an electrical influence on said second electron transmission protein film;
   a drain electrode connected to said third electron transmission protein film;
   said first, second, and third electron transmission films being coupled so as to form a driving transistor network in which a series connection of at least one circuit group consisting of at least one transistor with its drain and source connected in parallel to a pair of common drain and source terminals;
   said common drain terminal of the first circuit group in said series connection being connected to said output terminal;
   said common source terminal of the last circuit group in said series connection being connected to a second power supply having a potential lower than that of said first power supply;
   the gate of said transistor in said circuit group being connected to said input terminal;
   said load transistor and said driving transistor network being of the same type; and
   threshold voltages of said load and driving transistor network being substantially the same.

2. A logic circuit according to claim 1, wherein the numbers of said input terminal, said transistor, and said circuit group are one so that it functions as an inverter amplifier.

3. A logic circuit according to claim 1, wherein said first and third electron transmission protein films are made of a flavodoxin electron transmission protein.

4. A logic circuit according to claim 1, wherein said second electron transmission protein film is made of a cytochrome electron transmission protein.

5. A logic circuit according to claim 1, wherein said output is given by $$O = \overline{(I_{11} + I_{12} + \ldots + I_{1i}) * (I_{21} + \ldots + I_{2j}) * \ldots * (I_{l1} + \ldots I_{lk})}$$

wherein + and * mean the logical sum and the logical product, respectively, and I11 through I1i, I21 through I2j, and Il1 through Ilk are respective signals put into said input terminals.

6. A logic circuit according to claim 1, wherein said transistor is made of at least two kinds of electron transmission proteins having different redox potentials.

* * * * *